US009154222B2

(12) United States Patent
Cox et al.

(10) Patent No.: US 9,154,222 B2
(45) Date of Patent: Oct. 6, 2015

(54) COOLING SYSTEM CONTROL IN DISTRIBUTED ANTENNA SYSTEMS

(71) Applicant: Corning Cable Systems LLC, Hickory, NC (US)

(72) Inventors: Terry Dean Cox, Keller, TX (US); Ami Hazani, Ra'anana (IL)

(73) Assignee: Corning Optical Communications LLC, Hickory, NC (US)

( * ) Notice: Subject to any disclaimer, the term of this patent is extended or adjusted under 35 U.S.C. 154(b) by 173 days.

(21) Appl. No.: 13/950,397

(22) Filed: Jul. 25, 2013

(65) Prior Publication Data

US 2014/0037294 A1      Feb. 6, 2014

Related U.S. Application Data

(60) Provisional application No. 61/677,741, filed on Jul. 31, 2012.

(51) Int. Cl.
| | | |
|---|---|---|
| *G08B 21/00* | (2006.01) | |
| *H04B 10/07* | (2013.01) | |
| *H02H 7/093* | (2006.01) | |
| *H05K 7/20* | (2006.01) | |
| *G06F 1/20* | (2006.01) | |
| *H04B 10/2575* | (2013.01) | |
| *H04W 88/08* | (2009.01) | |

(52) U.S. Cl.
CPC ............... *H04B 10/07* (2013.01); *G06F 1/206* (2013.01); *H02H 7/093* (2013.01); *H04B 10/25753* (2013.01); *H05K 7/20209* (2013.01); *H04W 88/085* (2013.01)

(58) Field of Classification Search
CPC ..... H02H 3/04; H02H 7/093; H05K 7/20209; G06F 1/206
USPC .......... 340/635, 644, 648, 660, 664; 318/478; 361/24, 79; 455/572
See application file for complete search history.

(56) References Cited

U.S. PATENT DOCUMENTS

| | | | |
|---|---|---|---|
| 5,534,854 A | 7/1996 | Bradburry et al. | 341/648 |
| 5,559,831 A | 9/1996 | Keith | 375/240 |
| 5,889,469 A | 3/1999 | Mykytiuk et al. | 340/635 |
| 6,060,879 A * | 5/2000 | Mussenden | 340/648 |
| 6,163,266 A | 12/2000 | Fasullo et al. | 340/664 |
| 6,551,065 B2 * | 4/2003 | Lee | 318/478 |
| 7,142,125 B2 | 11/2006 | Larson et al. | 340/635 |
| 7,619,535 B2 * | 11/2009 | Chen et al. | 340/635 |
| 7,852,228 B2 | 12/2010 | Teng et al. | 340/648 |
| 8,514,092 B2 * | 8/2013 | Cao et al. | 340/644 |
| 2008/0251071 A1 | 10/2008 | Armitstead et al. | 128/202.22 |
| 2008/0272725 A1 | 11/2008 | Bojrup et al. | 318/434 |
| 2014/0087742 A1 * | 3/2014 | Brower et al. | 455/572 |

FOREIGN PATENT DOCUMENTS

| | | | |
|---|---|---|---|
| CN | 101030162 A | 9/2007 | G06F 11/32 |
| JP | 58055770 A | 4/1983 | G01R 31/34 |

* cited by examiner

*Primary Examiner* — John A Twell, Jr.

(57) ABSTRACT

Power distribution modules in distributed antenna systems include fan monitoring circuits for indicating an alarm condition to head-end equipment. The alarm condition can be used by system operator/owners that a fan is drawing excessive power, thereby detracting from system performance, or indicating that the fan may fail. The alarm condition signal can be returned to the head-end equipment via an uplink communication path between a remote unit powered by the module and the head-end equipment.

33 Claims, 11 Drawing Sheets

COOLING SYSTEM CONTROL IN DISTRIBUTED ANTENNA SYSTEMS

PRIORITY APPLICATION

This application claims the benefit of priority under 35 U.S.C. §119 of U.S. Provisional Application No. 61/677,741 filed on Jul. 31, 2012 the content of which is relied upon and incorporated herein by reference in its entirety.

RELATED APPLICATIONS

This application is related to PCT Application No. PCT/US11/61761, filed Nov. 22, 2011, to U.S. patent application Ser. No. 12/466,514, filed May 15, 2009, and to U.S. application Ser. No. 13/899,118, filed May 21, 2013, which are incorporated herein by reference in their entireties.

BACKGROUND

1. Field of the Disclosure

The technology of the disclosure relates to systems and methods for monitoring cooling systems in a distributed antenna system.

2. Technical Background

Wireless communication is rapidly growing, with increasing demands for high-speed mobile data communication. As an example, so-called "wireless fidelity" or "WiFi" systems and wireless local area networks (WLANs) are being deployed in many different types of areas (e.g., coffee shops, airports, libraries, etc.). Distributed communications or antenna systems communicate with wireless devices called "clients," which must reside within the wireless range or "cell coverage area" in order to communicate with an access point device.

One approach to deploying a distributed antenna system involves the use of radio frequency (RF) antenna coverage areas, also referred to as "antenna coverage areas." Antenna coverage areas can have a radius in the range from a few meters up to twenty meters as an example. One type of distributed antenna system for creating antenna coverage areas, called "Radio-over-Fiber" or "RoF," utilizes RF communications signals sent over optical fibers. Both types of systems can include head-end equipment coupled to a plurality of remote antenna units (RAUs) that each provides antenna coverage areas. The RAUs can each include RF transceivers coupled to an antenna to transmit RF communications signals wirelessly, wherein the RAUs are coupled to the head-end equipment via the communication medium. The RAUs contain power-consuming components, such as the RF transceiver, to transmit and receive RF communications signals and thus require power to operate. Power may be provided to the RAUs from remote power supplies, such as at an IDF (intermediate distribution frame), or interconnect unit (ICU) closet at each floor of the building infrastructure.

Power supplies generate considerable heat, and often fans are used to dissipate the heat generated during operation of the distributed antenna system. However, as cooling fans continue to run, the drag on the fan motor will increase over time. This drag typically results from increased friction in the fan's motor bearings resulting from the limited life of the bearing lubrication. The drag can also be caused by an increase in the fan's static pressure, such as when debris accumulates in the fan filter. As fan drag increases, the fan's controller increases the current to the fan motor to ensure that the fan blades maintain a constant rate of revolution.

No admission is made that any reference cited herein constitutes prior art. Applicant reserves the right to challenge the accuracy and pertinency of any cited documents.

SUMMARY

According to one aspect of the present embodiments, a distributed communication system comprises head-end equipment configured to receive downlink electrical radio frequency (RF) communications services signals and to convert the downlink electrical RF communications services signals into downlink optical RF communications services signals to be communicated over an optical RF communications services downlink, a plurality of remote antenna units, and a plurality of power distribution modules. The power distribution modules comprise a fan, an output power port configured to distribute the output power to at least one of the remote antenna units, and a monitoring circuit. The monitoring circuit is configured to monitor power usage of the fan and to provide an alarm signal to a remote antenna unit when the fan power usage is outside of predetermined operating parameters.

According to another aspect, a distributed communication system comprises head-end equipment configured to receive downlink RF communications services signals and to transmit downlink RF communications services over RF communications services downlinks, a plurality of remote antenna units configured to receive downlink RF communications services signals from the head-end equipment and to transmit uplink RF communications services signals to the head-end equipment, and power distribution modules configured to distribute power to the remote antenna units. The power distribution modules comprise a fan and are configured to monitor fan power and to provide an alarm signal to at least one of the remote antenna units when the fan power usage is outside of predetermined operating parameters. The remote antenna units are configured to transmit a fan alarm condition signal to the head-end equipment in response to receiving an alarm signal.

According to yet another aspect, a method is provided for monitoring a distributed communication system comprising head-end equipment configured to receive downlink RF communications services signals and to transmit downlink RF communications services over at least one RF communications services downlink, a plurality of remote antenna units configured to receive downlink RF communications services signals from the head-end equipment and to transmit uplink RF communications services signals to the head-end equipment, and power distribution modules configured to distribute power to the remote antenna units. The power distribution modules have fans for cooling the modules. The method comprises monitoring a power usage of a fan, providing an alarm signal to a remote antenna unit when fan power usage is outside of predetermined operating parameters, and transmitting a fan alarm condition signal from the remote antenna unit receiving the alarm condition signal to the head-end equipment.

Additional features and advantages are set forth in the detailed description, and in part will be readily apparent to those skilled in the art from the description or recognized by practicing the embodiments as described in the written description and claims hereof, as well as the appended drawings. The foregoing general description and the following detailed description are merely exemplary, and are intended to provide an overview or framework to understand the nature and character of the claims.

The drawings provide further understanding and are incorporated in and constitute a part of this specification. The drawings illustrate embodiments and together with the description explain principles and operation of the embodiments.

DETAILED DESCRIPTION

Embodiments disclosed in the detailed description include power distribution modules having cooling requirements in distributed antenna systems (DASs). In embodiments disclosed herein, the power distribution modules can be installed in and connected to a power unit for providing power to a power-consuming DAS component(s), such as a remote antenna unit(s) (RAU(s)). Main power is provided to the power unit and distributed to power distribution modules in the power unit. Power from the main power is distributed by each of the power distribution modules to any power-consuming DAS components connected to the power distribution modules. The power distribution modules distribute power to the power-consuming DAS components to provide power for DAS components.

Before discussing examples of cooling system monitoring and control in distributed antenna systems (DASs), exemplary distributed antenna systems capable of distributing RF communications signals to distributed or remote antenna units (RAUs) are first described with regard to FIGS. 1-3B. The distributed antenna systems in FIGS. 1-3B can include power units located remotely from RAUs that provide power to the RAUs for operation. The DASs in FIGS. 1-3B discussed below include distribution of radio frequency (RF) communications signals; however, the DASs are not limited to distribution of RF communications signals. Also, while the DASs in FIGS. 1-3B include distribution of communications signals over optical fiber, these DASs are not limited to distribution over optical fiber. Distribution mediums could also include, but are not limited to, coaxial cable, twisted-pair conductors, wireless transmission and reception, and any combination thereof.

Figure 1:
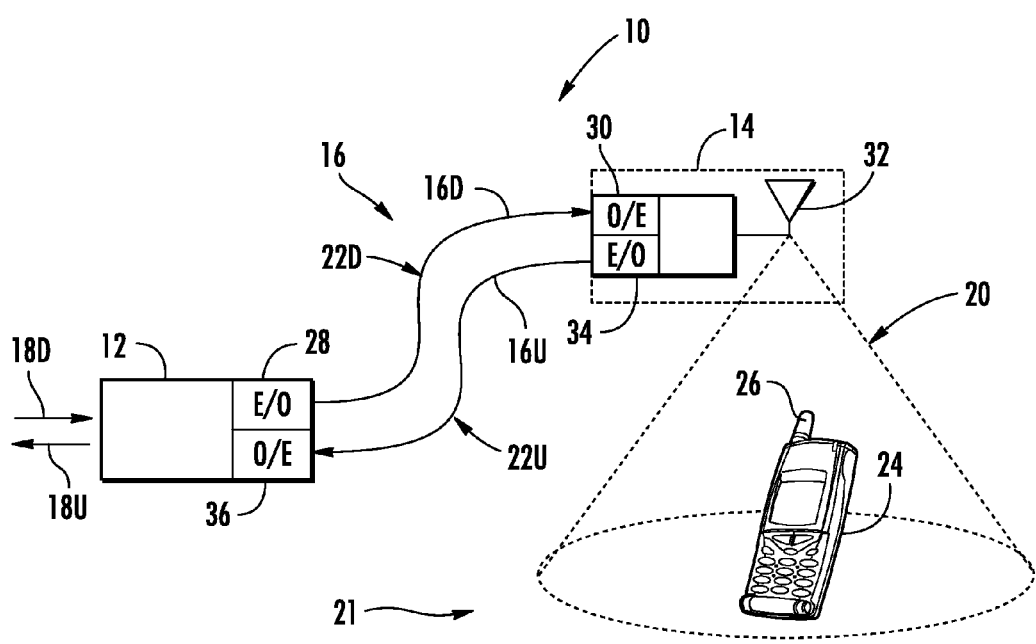
FIG. 1 is a schematic diagram of an exemplary distributed antenna system.

FIG. 1 is a schematic diagram of an embodiment of a distributed antenna system, or distributed communication system. In this embodiment, the DAS is an optical fiber-based distributed antenna system 10. The DAS 10 is configured to create one or more antenna coverage areas for establishing communications with wireless client devices located in the RF range of the antenna coverage areas. The DAS 10 provides RF communication services (e.g., cellular services). In this embodiment, the DAS 10 includes head-end equipment (HEE) 12 such as a head-end unit (HEU), one or more remote antenna units (RAUs) 14, and an optical fiber 16 that optically couples the HEE 12 to the RAU 14. The RAU 14 is a type of remote communications unit. In general, a remote communications unit can support either wireless communications, wired communications, or both. The RAU 14 can support wireless communications and/or wired communications. The HEE 12 is configured to receive communications over downlink electrical RF signals 18D from a source or sources, such as a network or carrier, and provide such communications to the RAU 14. The HEE 12 is also configured to return communications received from the RAU 14, via uplink electrical RF signals 18U, back to the source. In this embodiment, the optical fiber 16 includes at least one downlink optical fiber 16D to carry signals communicated from the HEE 12 to the RAU 14 and at least one uplink optical fiber 16U to carry signals communicated from the RAU 14 back to the HEE 12.

One downlink optical fiber 16D and one uplink optical fiber 16U could be provided to support multiple channels, each using wave-division multiplexing (WDM), as discussed in U.S. patent application Ser. No. 12/892,424, incorporated herein by reference in its entirety. Other options for WDM and frequency-division multiplexing (FDM) are disclosed in U.S. patent application Ser. No. 12/892,424, any of which can be employed in any of the embodiments disclosed herein. Further, U.S. patent application Ser. No. 12/892,424 also discloses distributed digital data communications signals in a DAS which may also be distributed in the optical fiber-based DAS 10 either in conjunction with RF communications signals or not.

The distributed antenna system 10 has an antenna coverage area 20 that can be disposed about the RAU 14. The antenna coverage area 20 of the RAU 14 forms an RF coverage area 21. The HEE 12 is adapted to perform or to facilitate any one of a number of Radio-over-Fiber (RoF) applications, such as RF identification (RFID), wireless local-area network (WLAN) communication, or cellular phone service. Shown within the antenna coverage area 20 is a client device 24 in the form of a cellular telephone. The client device 24 can be any device that is capable of receiving RF communications signals. The client device 24 includes an antenna 26 (e.g., a wireless card) adapted to receive and/or send electromagnetic RF signals. To communicate the electrical RF signals over the downlink optical fiber 16D to the RAU 14, to in turn be communicated to the client device 24 in the antenna coverage area 20 formed by the RAU 14, the HEE 12 includes a radio interface in the form of an electrical-to-optical (E/O) converter 28. The E/O converter 28 converts the downlink electrical RF signals 18D to downlink optical RF signals 22D to be communicated over the downlink optical fiber 16D. The RAU 14 includes an optical-to-electrical (O/E) converter 30 to convert received downlink optical RF signals 22D back to electrical RF signals to be communicated wirelessly through an antenna 32 of the RAU 14 to client devices 24 located in the antenna coverage area 20.

Similarly, the antenna 32 is also configured to receive wireless RF communications from client devices 24 in the antenna coverage area 20. The antenna 32 receives wireless RF communications from client devices 24 and communicates electrical RF signals representing the wireless RF communications to an E/O converter 34 in the RAU 14. The E/O converter 34 converts the electrical RF signals into uplink optical RF signals 22U to be communicated over the uplink optical fiber 16U. An O/E converter 36 provided in the HEE 12 converts the uplink optical RF signals 22U into uplink electrical RF signals, which can then be communicated as uplink electrical RF signals 18U back to a network or other source.

Figure 2:
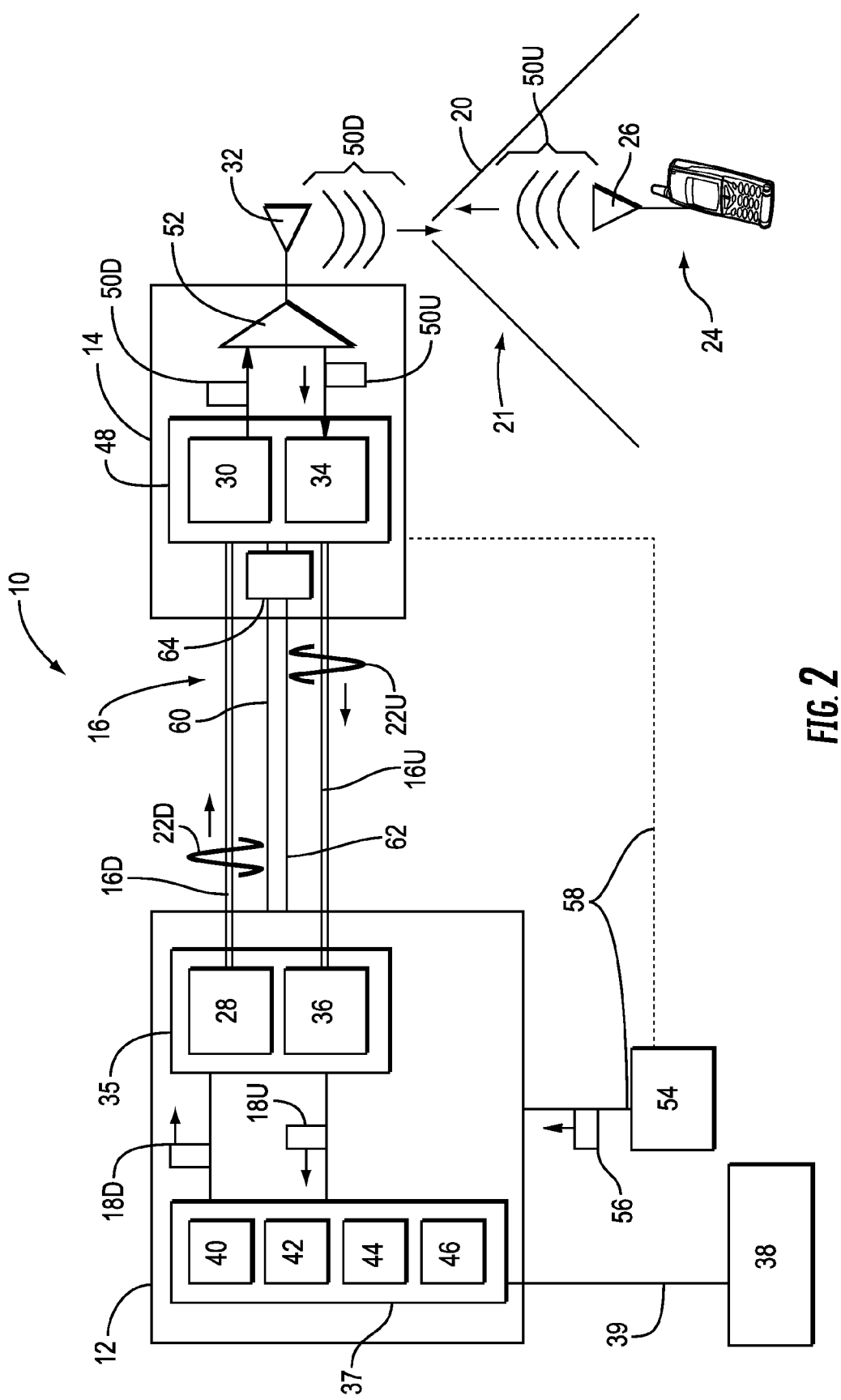
FIG. 2 is a more detailed schematic diagram of head-end equipment and a remote antenna unit (RAU) that can be deployed in the distributed antenna system of FIG. 1.

FIG. 2 is a more detailed schematic diagram of the exemplary distributed antenna system 10 of FIG. 1 that provides electrical RF service signals. The HEE 12 includes a service unit 37 that provides electrical RF service signals by passing such signals from one or more outside networks 38 via a network link 39. In one embodiment, this includes providing cellular signal distribution in the frequency range from 400 MegaHertz (MHz) to 2.7 GigaHertz (GHz). In another embodiment, the service unit 37 provides electrical RF service signals by generating the signals directly.

The service unit 37 is electrically coupled to the E/O converter 28 that receives the downlink electrical RF signals 18D from the service unit 37 and converts them to corresponding downlink optical RF signals 22D. The E/O converter 28 includes a laser suitable for delivering sufficient dynamic range for the RoF applications described herein, and optionally includes a laser driver/amplifier electrically coupled to the laser. The HEE 12 also includes the O/E converter 36, which is electrically coupled to the service unit 37. The O/E converter 36 receives the uplink optical RF signals 22U and converts them to corresponding uplink electrical RF signals 18U. The E/O converter 28 and the O/E converter 36 constitute a "converter pair" 35, as illustrated in FIG. 2.

The service unit 37 in the HEE 12 can include an RF signal conditioner unit 40 for conditioning the downlink electrical RF signals 18D and the uplink electrical RF signals 18U, respectively. The service unit 37 can include a digital signal processing unit 42 for providing to the RF signal conditioner unit 40 an electrical signal that is modulated onto an RF carrier to generate a desired downlink electrical RF signal 18D. The digital signal processor 42 is also configured to process a demodulation signal provided by the demodulation of the uplink electrical RF signal 18U by the RF signal conditioner unit 40. The HEE 12 can also include a central processing unit (CPU) 44 for processing data and otherwise performing logic and computing operations, and a memory unit 46 for storing data, such as data to be transmitted over a WLAN or other network.

The RAU 14 also includes a converter pair 48 comprising the O/E converter 30 and the E/O converter 34. The O/E converter 30 converts the received downlink optical RF signals 22D from the HEE 12 back into downlink electrical RF signals 50D. The E/O converter 34 converts uplink electrical RF signals 50U received from the client device 24 into the uplink optical RF signals 22U to be communicated to the HEE 12. The O/E converter 30 and the E/O converter 34 are electrically coupled to the antenna 32 via an RF signal-directing element 52. The RF signal-directing element 52 directs the downlink electrical RF signals 50D and the uplink electrical RF signals 50U, as discussed below.

The DAS 10 also includes a power system 54 that includes a power supply and provides an electrical power signal 56. The power system 54 is electrically coupled to the HEE 12 for powering the power-consuming elements therein. In one embodiment, an electrical power line 58 runs through the HEE 12 and over to the RAU 14 to power the O/E converter 30 and the E/O converter 34 in the converter pair 48, the optional RF signal-directing element 52 (unless the RF signal-directing element 52 is a passive device such as a circulator for example), and any other power-consuming elements in the DAS. The electrical power line 58 includes two wires 60 and 62 that carry a voltage, and are electrically coupled to a DC power converter 64 at the RAU 14. The DC power converter 64 is electrically coupled to the O/E converter 30 and the E/O converter 34 in the converter pair 48, and changes the voltage or levels of the electrical power signal 56 to the power level(s) required by the power-consuming components in the RAU 14. The DC power converter 64 is either a DC/DC power converter or an AC/DC power converter, depending on the type of electrical power signal 56 carried by the electrical power line 58. In another example embodiment, the electrical power line 58 (dashed line) runs directly from the power system 54 to the RAU 14 rather than from or through the HEE 12.

Figure 3A:
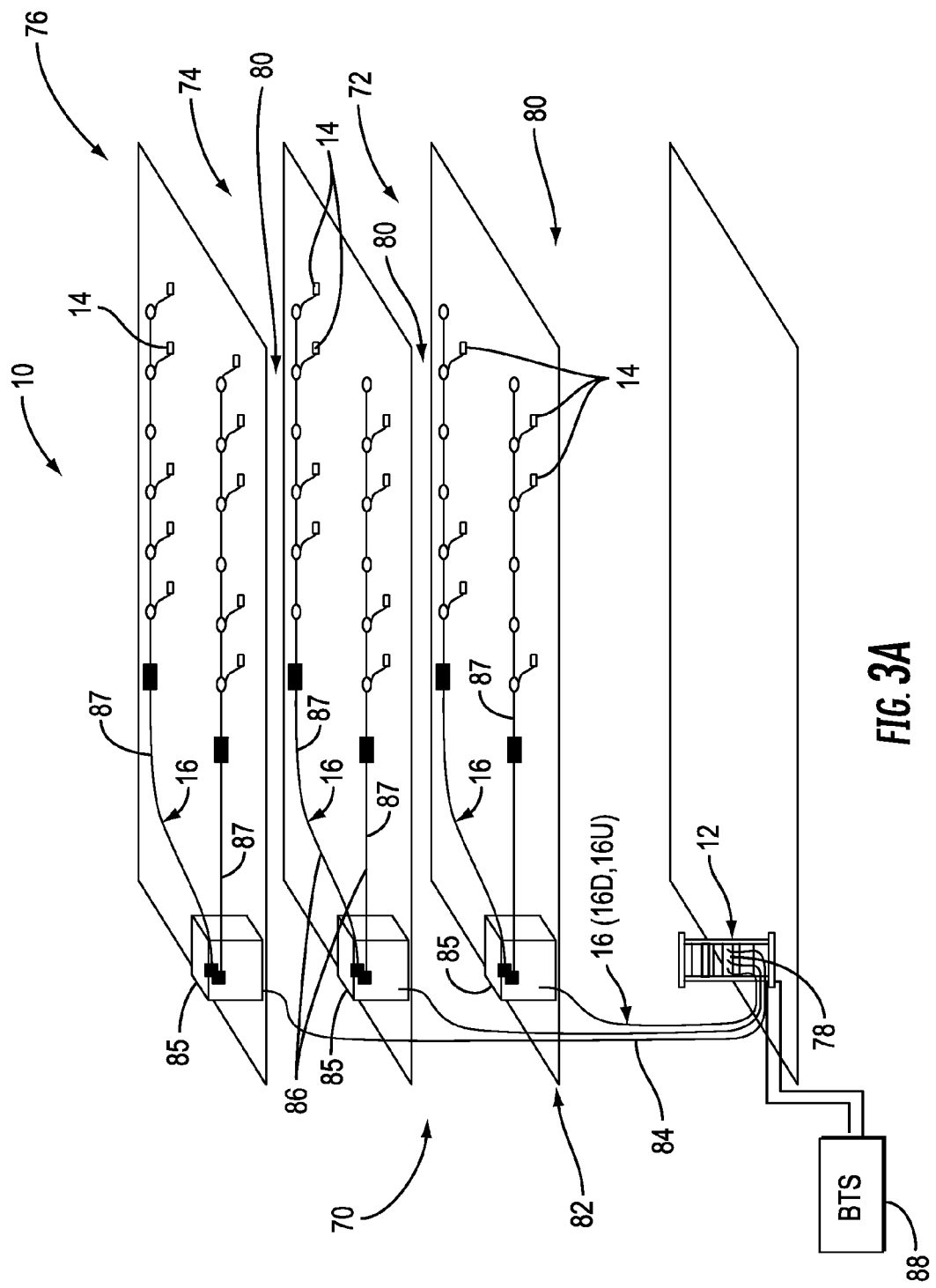
FIG. 3A is a partially schematic cut-away diagram of an exemplary building infrastructure in which the distributed antenna system in FIG. 1 can be employed.

To provide further illustration of how a DAS can be deployed indoors, FIG. 3A illustrates a partially schematic cut-away diagram of a building infrastructure 70 employing an optical fiber-based DAS. The system may be the system 10 of FIGS. 1 and 2. The building infrastructure 70 generally represents any type of building in which the system 10 can be deployed. As previously discussed with regard to FIGS. 1 and 2, the system 10 incorporates the HEE 12 to provide various types of communication services to coverage areas within the building infrastructure 70.

The building infrastructure 70 includes a first (ground) floor 72, a second floor 74, and a third floor 76. The floors 72, 74, 76 are serviced by the HEE 12 through a main distribution frame 78 to provide antenna coverage areas 80 in the building infrastructure 70. Only the ceilings of the floors 72, 74, 76 are shown in FIG. 3A for simplicity of illustration. In the example embodiment, a main cable 82 has a number of different sections that facilitate the placement of a large number of RAUs 14 in the building infrastructure 70. Each RAU 14 in turn services its own coverage area in the antenna coverage areas 80. The main cable 82 can include a riser cable 84 that carries all of the downlink and uplink optical fibers 16D, 16U to and from the HEE 12.

Figure 3B:
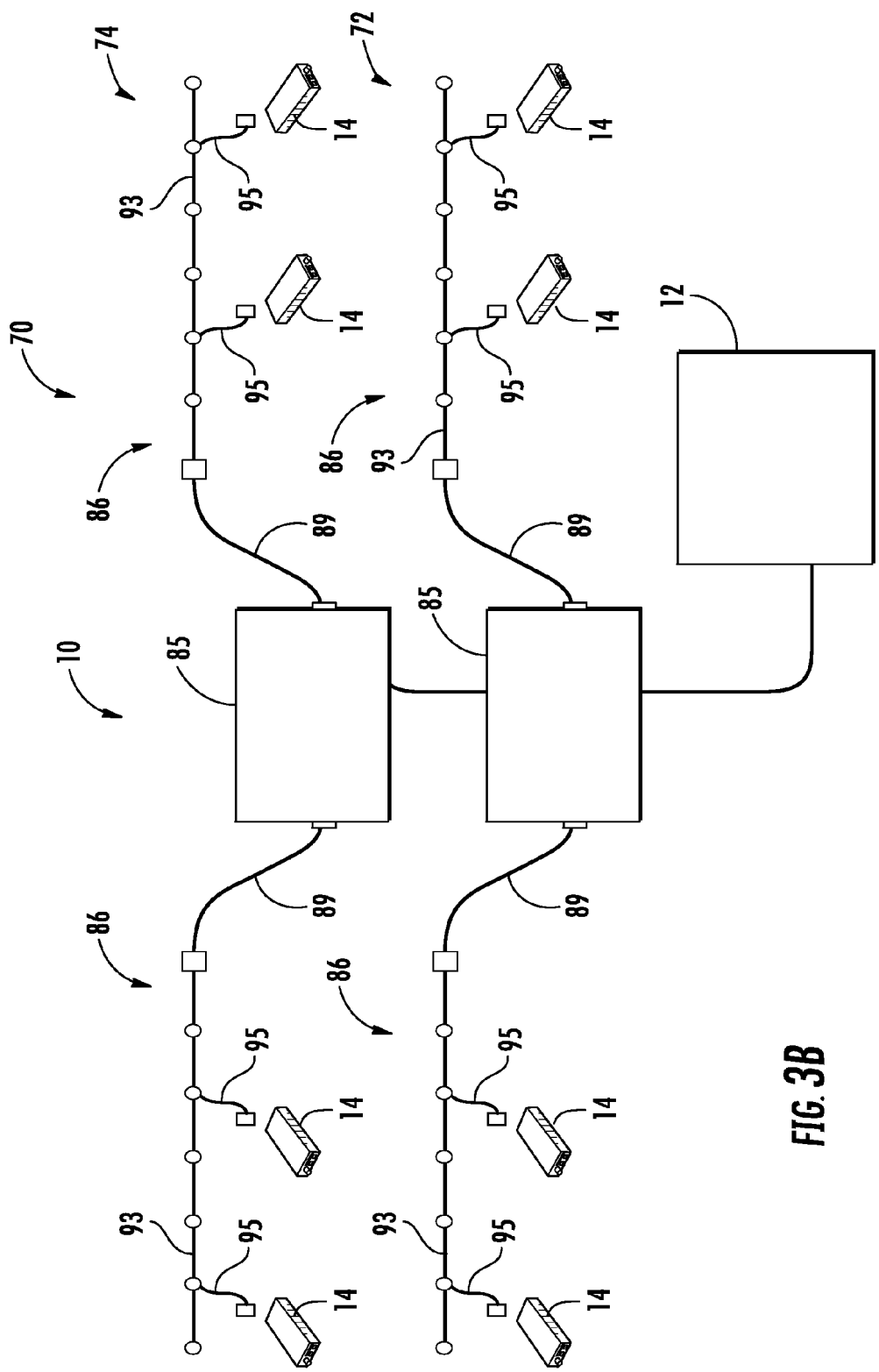
FIG. 3B is an alternative diagram of the distributed antenna system in FIG. 3A.

The riser cable 84 may be routed through a power unit 85. The power unit 85 may be provided as part of or separate from the power system 54 in FIG. 2. The power unit 85 may also be configured to provide power to the RAUs 14 via the electrical power line 58, as illustrated in FIG. 2 and discussed above, provided inside an array cable 87, or tail cable or home-run tether cable as other examples, and distributed with the downlink and uplink optical fibers 16D, 16U to the RAUs 14. For example, as illustrated in the building infrastructure 70 in FIG. 3B, a tail cable 89 may extend from the power units 85 into an array cable 93. Downlink and uplink optical fibers in tether cables 95 of the array cables 93 are routed to each of the RAUs 14, as illustrated in FIG. 3B. The main cable 82 can include one or more multi-cable (MC) connectors adapted to connect select downlink and uplink optical fibers 16D, 16U, along with an electrical power line, to a number of optical fiber cables 86.

The main cable 82 enables multiple optical fiber cables 86 to be distributed throughout the building infrastructure 70 (e.g., fixed to the ceilings or other support surfaces of each floor 72, 74, 76) to provide the antenna coverage areas 80 for the first, second, and third floors 72, 74, and 76. The HEE 12 may be located within the building infrastructure 70 (e.g., in a closet or control room), or located outside of the building infrastructure 70 at a remote location. A base transceiver station (BTS) 88, which may be provided by a second party such as a cellular service provider, is connected to the HEE 12. A BTS is any station or signal source that provides an input signal to the HEE 12 and can receive a return signal from the HEE 12. In a typical cellular system, for example, a plurality of BTSs are deployed at a plurality of remote locations to provide wireless telephone coverage. Each BTS serves a corresponding cell and when a mobile client device enters the cell, the BTS communicates with the mobile client device.

With reference to FIG. 3A, RAUs 14 installed on a given floor 72, 74, or 76 may be serviced from the same optical fiber 16. In this regard, the optical fiber 16 may have multiple nodes where distinct downlink and uplink optical fiber pairs can be connected to a given RAU 14. One downlink optical fiber 16D could be provided to support multiple channels each using wavelength-division multiplexing (WDM), as discussed in U.S. patent application Ser. No. 12/892,424, incorporated herein by reference in its entirety. Other options for WDM and frequency-division multiplexing (FDM) are also disclosed in U.S. patent application Ser. No. 12/892,424, any of which can be employed in any of the embodiments disclosed herein. The HEE 12 may be configured to support any frequencies desired, such as those described in PCT Application No. PCT/US11/617, and the structure and operation of the system can be in accordance with PCT Application No. PCT/US11/617.

Figure 4:
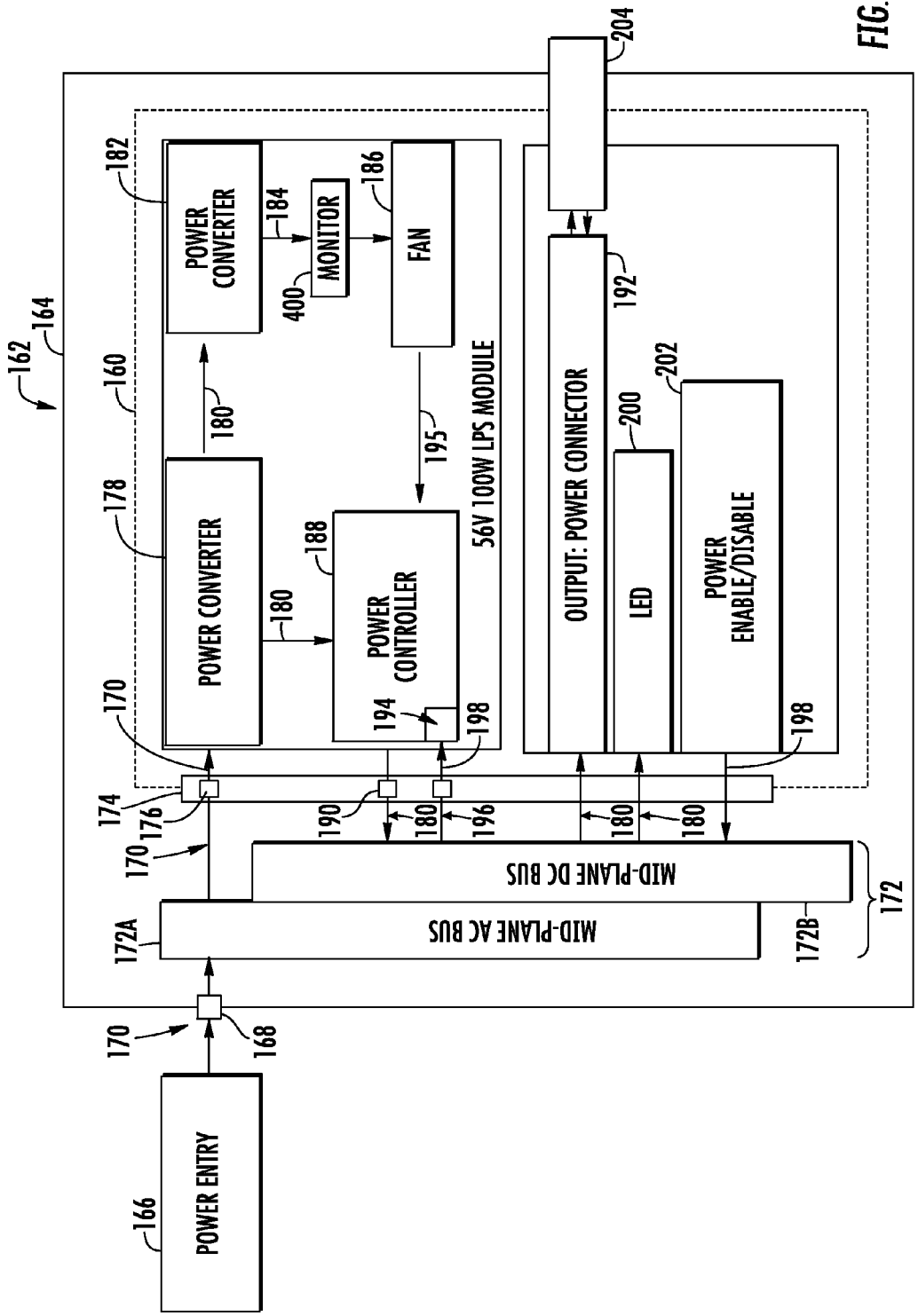
FIG. 4 is a schematic diagram of an exemplary power distribution module.

FIG. 4 is a schematic diagram of an exemplary power distribution module 160 that can be employed to provide power to RAUs or other power-consuming DAS components. In this embodiment, the power distribution module 160 is disposed in a power unit 162. The power unit 162 may serve as the power unit 85 described above to remotely provide power to the RAUs 14. The power unit 162 may be comprised of a chassis 164 or other housing that is configured to support power distribution modules 160. The power unit 162 provides support for receiving power from an external power source 166, which may be AC power, to the power unit 162 to then be distributed within the power unit 162 to the power distribution modules 160 disposed therein. The power unit 162 may be configured to support multiple power distribution modules 162. Each power distribution module 162 may be configured to provide power to multiple RAUs 14. The power unit 162 contains an external input power port 168 disposed in the chassis 164. The external input power port 168 is configured to be electrically coupled to the external power source 166 to supply input power 170 to the external input power connector 168. For example, the external power source 166 may be AC power, and may be either 110 Volts (V) or 220 Volts (V). To distribute the power from the external power source 166 to the power distribution modules 160 disposed in the power unit 162, the power unit 162 contains a midplane interface connector 172. In this embodiment, the midplane interface connector 172 is comprised of an AC connector 172A to carry AC signals, and a DC connector 172B to carry DC signals. The power distribution module 160 contains a complementary connector 174 that can be connected to the midplane interface connector 172 to electrically connect the power distribution module 160 to the power unit 162. For example, the power unit 162 may contain a midplane interface bus that contains a plurality of midplane interface connectors 172 to allow a plurality of power distribution modules 160 to interface with the midplane interface bus.

The power distribution module 160 includes an input power port 176 that is configured to receive input power from the external power source 166. The input power port 176 is provided as part of the connector 174 to allow the source 166 to be electrically coupled to the input power port 176 and thus to the module 160. The module 160 contains an optional power converter 178 to convert the input power 170 from the external power source 166 to DC power 180. The power converter 178 is electrically coupled to the input power port 176 to receive the input power 170 from the external power source 166. The power converter 178 converts the input power 170 from the external power source 166 to output power 180, which is DC power in this example. For example, the power converter 178 may convert the input power 170 to 56 VDC output power 180. A secondary power converter 182 receives the output power 180 and converts the output power 180 to a second output power 184 at a different voltage, such as 12 VDC for example, to provide power to a cooling fan 186 in the module 160. According to one aspect of the present embodiment, a monitoring circuit 400 can be disposed in the electrical power supply path of the cooling fan 186, as discussed in further detail below with reference to FIGS. 9 and 10.

Still referring to FIG. 4, the power converter 178 may also distribute the output power 180 to a power controller 188. As will be described in more detail below, the power controller 188 controls whether the output power 180 is distributed to an output power port 190 to be distributed to power-consuming DAS devices electrically coupled to the output power port 190. The output power port 190 is electrically coupled to an output power connector 192 through the connectors 172, 174, as illustrated in FIG. 4. Thus, the output power 180 can be distributed to power-consuming DAS devices by electrical coupling to the output power connector 192 in the power distribution module 160. The power controller 188 contains a power enable port 194 and selectively distributes the output power 180 to the output power port 190 based on a power enable signal 196 provided on a power enable line 198 coupled to the power enable port 194. The power controller 188 is thus configured to distribute the output power 180 to the output power port 190 if the power enable signal 196 communicated on the power enable line 198 indicates to activate power. Activation of power means providing the output power 180 to the output power port 190 to be distributed to power-consuming DAS devices electrically coupled to the output power port 190. When output power 180 is activated and supplied to the output power connector 192, the output power 180 may also be coupled to a light to signify that output power 180 is active at the output power connector 192. The power controller 188 is also configured to not distribute the output power 180 to the output power port 190 if the power enable signal 196 communicated on the power enable line 198 indicates to deactivate power.

With continuing reference to FIG. 4, one source of the power enable signal 196 is the power disable/enable feature 202. The power enable/disable feature 202 closes a circuit on the power enable line 198 when an output power connector 204 is connected to the output power connector 192 of the power distribution module 160. When connected, the output power connector 204 will then be electrically coupled to the connector 174 of the power distribution module 160 which is connected to the midplane interface connector 172 of the power unit 162 when the power distribution module 160 is installed. The power enable/disable feature 202 may only be configured to close the circuit on the power enable line 198 until all other conductors of the output power connector 204 coupled to the output power connector 192 are fully electrically coupled to the midplane interface connector 172 via the connector 174. In this manner, electrical arcing between the output power connector 204 and the output power connector 192 may be avoided, because the power controller 188 does not provide output power 180 to the output power port 190 and the output power connector 192 until complete electrical coupling is established between the output power connector 204 and the output power connector 192. If the output power 180 was being provided to the output power port 190 before a complete electrical connection was made between the output power connector 192 and the output power connector 204, electrical arcing and/or electrical conductor corrosion may occur. Electrical arcing may occur during disconnection of the output power connector 204 from the output power connector 192 due to the output power 180 being "hot" and being actively supplied to the output power connector 192. The power controller 188 herein allows an output power connector 204 to be disconnected from the output power connector 192 while the input power 170 is "hot" or active, because the power enable/disable feature 202 is configured to open the circuit to the power enable line 198 to cause the power controller 188 to not provide the output power 180 to the output power port 190 before the electrical contact is decoupled between the output power connector 204 and the output power connector 192.

The power distribution module 160 is also configured to activate and deactivate providing output power 180 to the output power connector 192 upon installation (i.e., connection) or removal (i.e., disconnection) of the power distribution module 160 from the power unit 162. More specifically, the power enable/disable feature 202 is configured to only close the circuit on the power enable line 198 to enable the power controller 188 to provide output power 180 until all other conductors of the connector 174 of the power distribution module 160 are completely coupled to the midplane interface connector 172 during installation of the power distribution module 160 in the power unit 162. In this manner, electrical arcing between the output power connector 204 and the output power connector 192 may be avoided when the power distribution module 160 is installed in the power unit 162 when input power 170 is "hot." The internal components of the power distribution module 160 in FIG. 4 and the power unit 162 may be as shown in PCT Application No. PCT/US11/61761.

Figure 5:
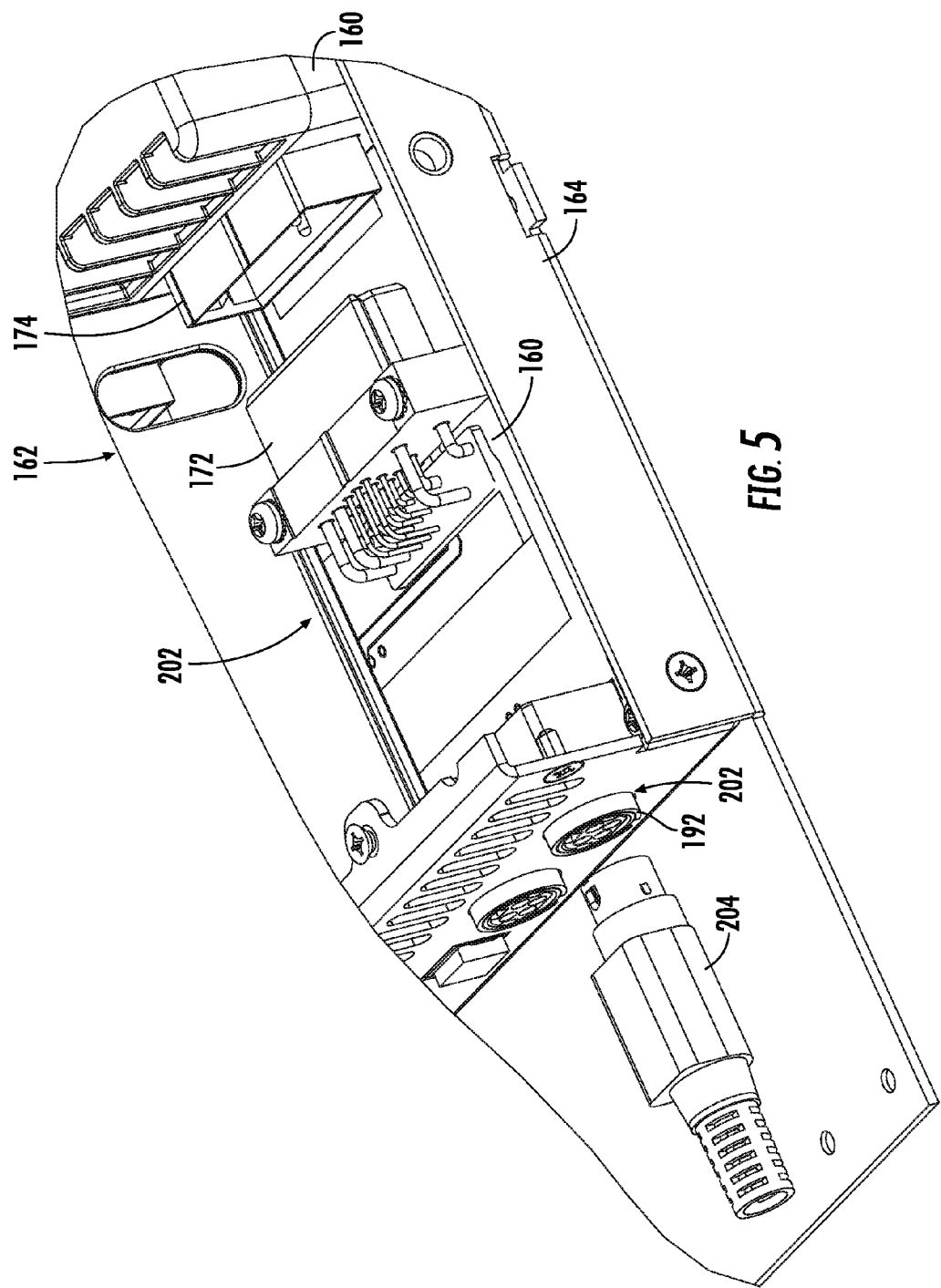
FIG. 5 is a side perspective view of an input power connector in the module of FIG. 4, and an output power connector of a power cable configured to be inserted into an output power connector in the power distribution module of FIG. 4.
Figure 6:
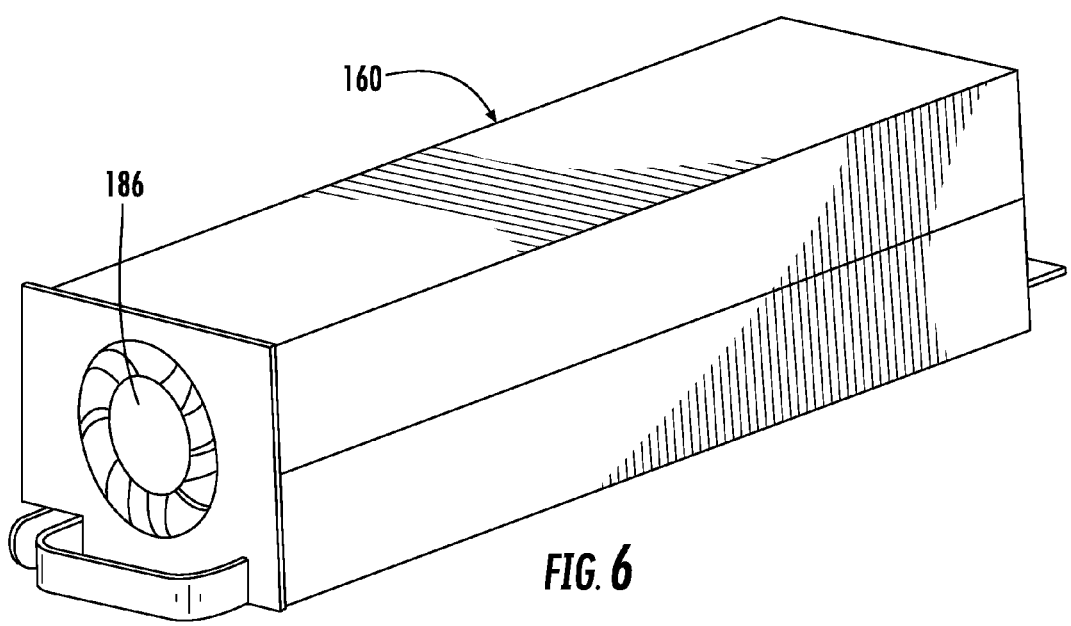
FIG. 6 illustrates a front, side perspective view of an exemplary power distribution module with a cover installed.

FIG. 5 is a side perspective view of an output power connector 204 being connected to the output power connector 192 of the power distribution module 160. FIG. 5 also shows the connector 174 of power distribution module 160 about to be inserted into the midplane interface connector 172 of the power unit 162 to couple input power 170 to the power distribution module 160 to be distributed through the output power connector 192 to the output power connector 204 to least one power-consuming DAS device. FIG. 6 illustrates a front, side perspective view of an exemplary power distribution module 160 with a cover installed. The power converter 178 can be provided to produce any voltage level of DC power desired. In one embodiment, the power converter 178 can produce relatively low voltage DC current. A low voltage may be desired that is power-limited and Safety Extra Low Voltage (SELV) compliant, although such is not required.

Figure 7:
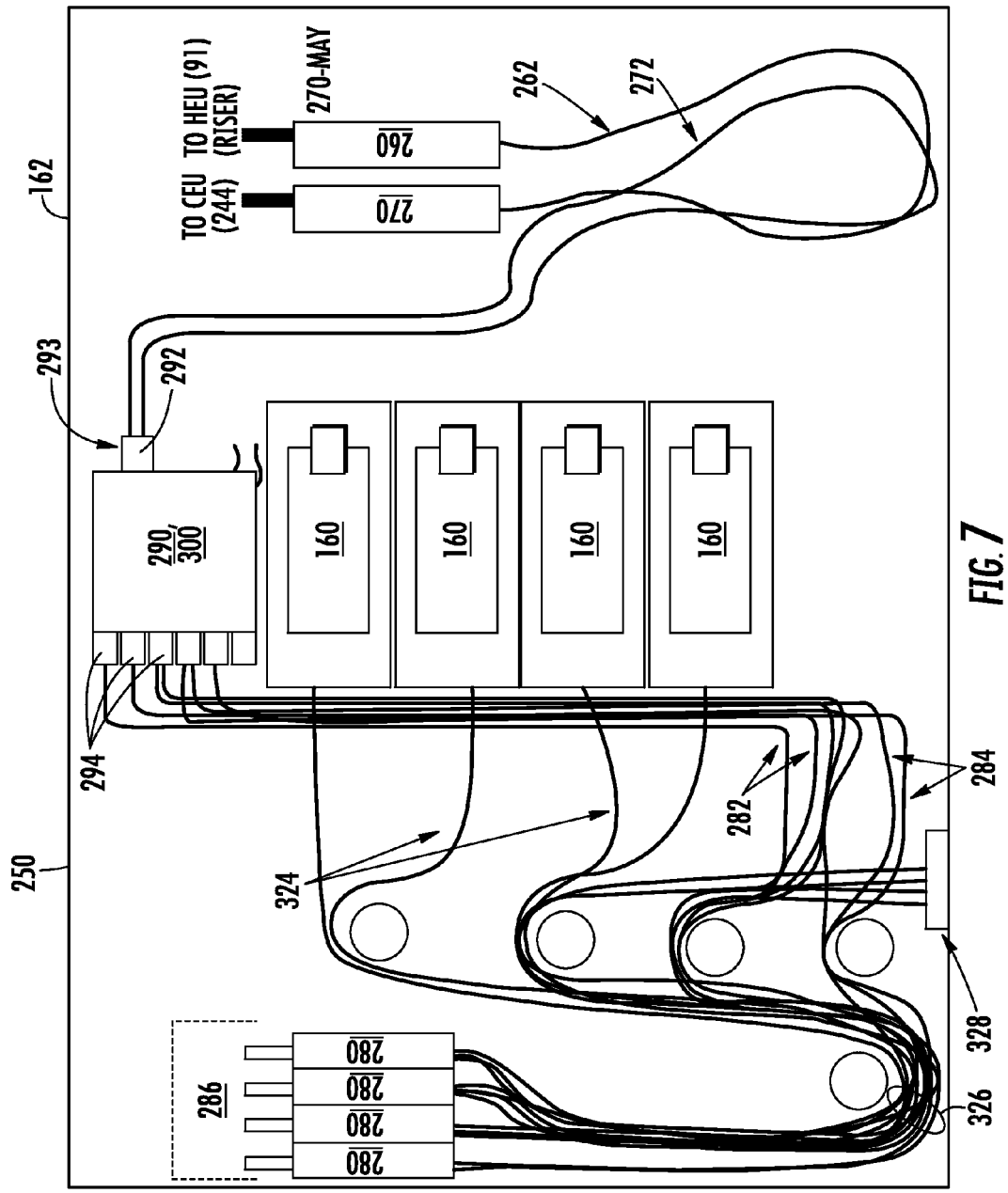
FIG. 7 is a schematic diagram of an exemplary power unit configured to support one or more power distribution modules to provide power to RAUs in a distributed antenna system.

As illustrated in FIG. 7, the power unit 162 (or, interconnect unit) may be provided in an enclosure 250. One or more power units 162 can be located on a floor of an office building, a multiple dwelling unit, etc. to provide power and connectivity to remote units on that floor. The exemplary power unit 162 is intended as a 1U rack mount configuration, although the power unit 162 may also be configured as a 3U version, for example, to accommodate additional remote units. A furcation 260, located inside the enclosure 250, of the riser cable 84 (e.g., FIG. 3A) breaks pairs of optical fibers from the riser cable 84 that are connected at an uplink end to the HEU 91, to provide optical communication input links to the HEU 91. The furcation 260 can be a Size 2 Edge™ Plug furcation, Part 02-013966-001 available from Corning Cable Systems LLC of Hickory N.C. If the CEU 244 is located with the HEU 91, optical fibers connecting the CEU 244 to the power unit 162 can be included in the riser cable 84. A furcation 270 breaks fiber pairs from the CEU 244 to provide optical communication input links to the CEU 244. The furcation 270 can be a Size 2 Edge™ Plug furcation, Part 02-013966-001 available from Corning Cable Systems LLC.

The optical communication input links from the HEU 91 and the CEU 244 are downlink and uplink optical fiber pairs to be connected to the remote units. In this embodiment, the furcated leg contains eight (8) optical fiber pairs to provide connections from the CEU 244 and HEU 91 to up to four (4) remote units, although any number of fibers and remote units can be used. The legs are connected to the power unit 162 at furcations 280, which can be arranged as two rows of four 2-fiber connectors on one face of the enclosure 250. The illustrated furcations 280 are internally mounted in the enclosure 250, but can also mounted on a tray 286 secured to the enclosure 250.

For communication between the HEU 91 and the remote units, the furcated leg 262 from the furcation 260 can be pre-connectorized with a fiber-optic connector to facilitate easy connection to a first adapter module 290 within the power unit 162. The first adapter module 290 includes a multi-fiber connector 292 that receives the connector of the furcated leg 262. The connector 292 can be, for example, a 12-fiber MTP connector. A series of six 2-fiber connectors 294, for example, at the other side of the first adapter module 290, connects to fiber pairs 282 from each furcation 280. Each fiber pair 282 can be connectorized with a 2-fiber connector that connects to one of six connectors 294 of the first adapter module 290. In this arrangement, the first adapter module 290 has the capacity to receive twelve fibers at the connector 292, and six separate connectorized fiber pairs 282. This exemplary arrangement allows for optical communication between six remote units and the HEU 91, although only four such connections are shown. The first adapter module 290 can be, for example, a 12/F LC EDGE™ Module/07-016841 for riser connection available from Corning Cable Systems LLC.

The furcated leg 272 from the furcation 270 can be pre-connectorized with a fiber-optic connector to facilitate easy connection to a second adapter module 300 within the power unit 162. In the illustrated embodiment, the second adapter module 300 is directly beneath the first adapter module 290, and thus is not visible in FIG. 7. The second adapter module 300 includes a multi-fiber connector 293 that receives the connector of the leg 272. The connector 293 can be, for example, a 12-fiber MTP connector. A series of six 2-fiber connectors, for example, at the other side of the second adapter module 300, connects to fiber pairs 284 from each furcation 280. Each fiber pair 284 can be connectorized with a 2-fiber connector that connects to one of six connectors of the second adapter module 300. In this arrangement, the second adapter module 300 has the capacity to receive twelve fibers at the connector 293, and six separate connectorized fiber pairs 284. This arrangement allows for optical communication between, for example, six Ethernet modules that are collocated or within respective remote units, and the CEU 244, although only four such connections are shown in the illustrated embodiment. The second adapter module 300 can be, for example, a 12/F LC EDGE™ Module/07-016841 for riser connection available from Corning Cable Systems LLC.

One or more power distribution modules 160 can be included in the enclosure 250 of the power unit 162. According to one embodiment, one power distribution module 160 can be connected to each remote unit by a pair of electrical conductors. Electrical conductors include, for example, coaxial cable and twisted copper conductor pairs. Each power distribution module 160 is shown connected to a twisted pair of conductors 324. The modules 160 plug into a back plane and the conductors that power the remote units connect to the back plane with a separate electrical connector from the optical fibers, although hybrid optical/electrical connectors could be used. Each cable extending to remote units can include two fibers and two twisted copper conductor pairs. One power distribution module 160 can be assigned to each remote unit, based upon power requirements. If an add-on module, such as an Ethernet module, is included at a remote unit, a second power distribution module 160 can be assigned to power the add-on module. The allocation of power and optical connectivity is accordingly adaptable depending upon the number and power requirements of remote units, additional modules, and hardware, etc. The modules 160 can be connected to a power bus that receives local power at the power unit 162 location.

Figure 8:
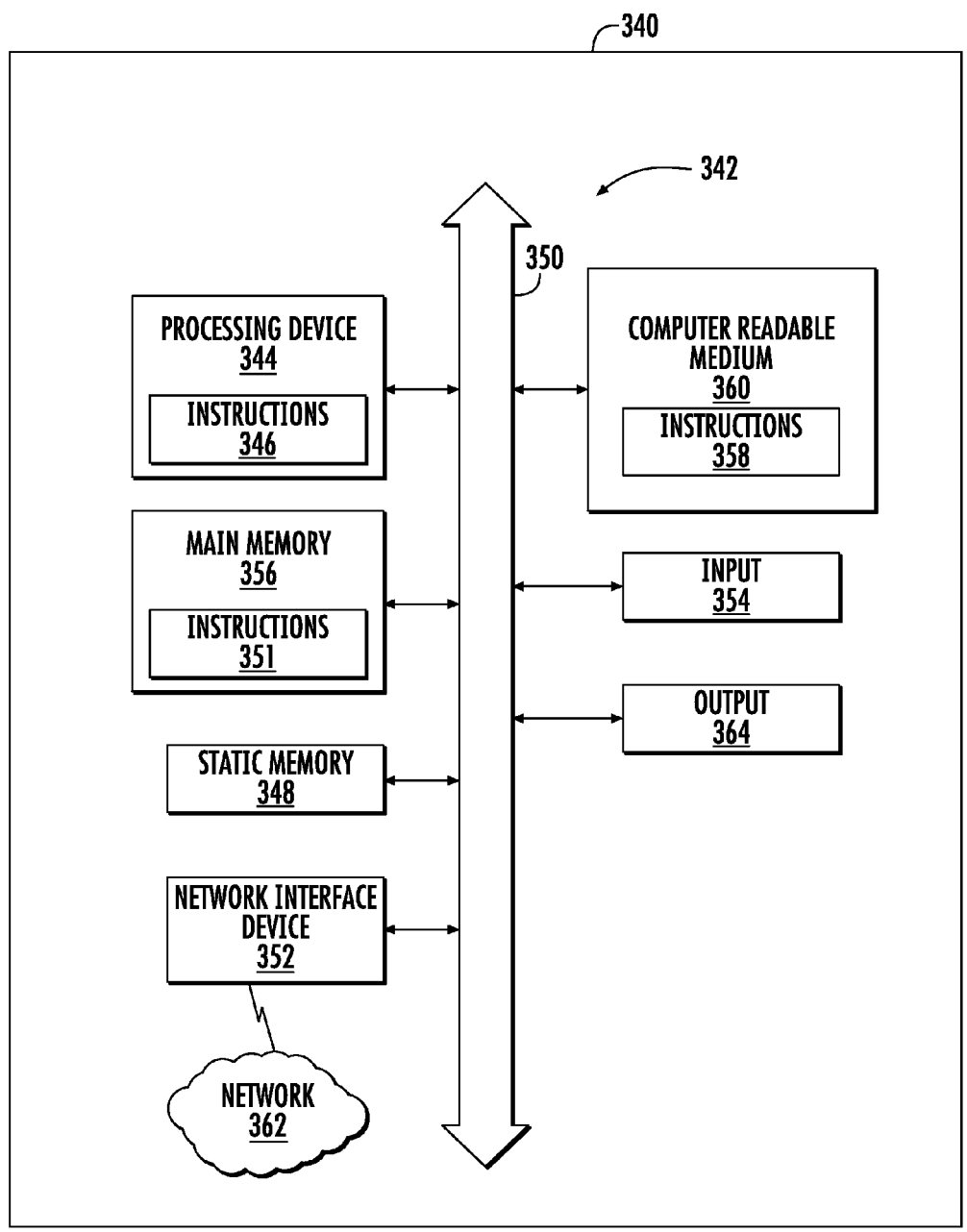
FIG. 8 is a schematic diagram of a computer system that can be included in the power distribution modules disclosed herein.

FIG. 8 is a schematic diagram of an exemplary computer system 340 that may be included in the power distribution module 160 and provided in the power controller 188. The computer system 340 is adapted to execute instructions from an exemplary computer-readable medium to perform power management functions. The computer system 400 may include a set of instructions for causing the power controller 188 to enable and disable coupling of power to the output power port 190, as previously described. The power controller 188 may be connected (e.g., networked) to other machines in a LAN, an intranet, an extranet, or the Internet. The power controller 188 may operate in a client-server network environment, or as a peer machine in a peer-to-peer (or distributed) network environment. The computer system 340 of the power controller 188 includes a processing device or processor 344, a main memory 356 and a static memory 348, which may communicate with each other via the data bus 350. Alternatively, the processing device 344 may be connected to the main memory 356 and/or static memory 348 directly or via some other connectivity means. The processing device 344 represents one or more general-purpose processing devices configured to execute processing logic in instructions 346 for performing the operations and steps discussed herein. The computer system 340 may further include a network interface device 352 and an input 354 to receive input and selections to be communicated to the computer system 340 when executing instructions. The computer system 340 may include a data storage device that includes instructions 358 stored in a computer-readable medium 360. The instructions 358 may also reside, completely or at least partially, within the main memory 356 and/or within the processing device 344 during execution thereof by the computer system 340, the main memory 356 and the processing device 344 also constituting computer-readable medium. The instructions 358 may further be transmitted or received over a network 362 via the network interface device 352.

Figure 9:
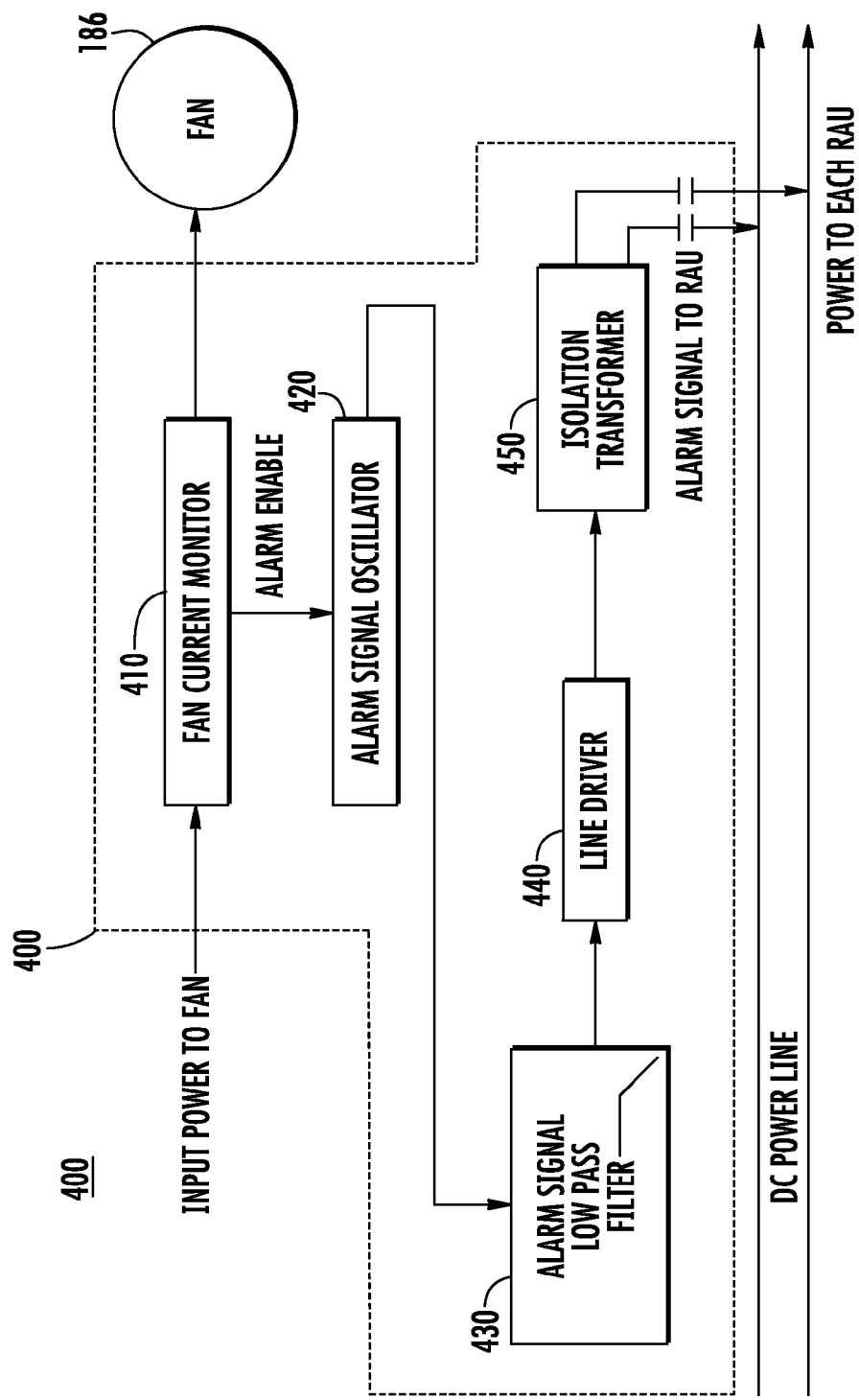
FIG. 9 is a schematic of a monitoring circuit that is suitable to provide monitoring for a fan used to cool a power module.

As previously discussed, the power distribution modules 160 may each include a fan 186 that is powered by the module 160, and each power module 85 (or 'interconnect unit') can include a plurality of power distribution modules 160 for powering RAUs 14. FIG. 9 is a schematic of a monitoring circuit 400 that is suitable to provide monitoring for the fans used to cool a power module, or to monitor cooling elements used to cool other components of a distributed antenna system. The circuit 400 can be, for example, suitable for monitoring the performance of the fans 186 in the power distribution modules 160 illustrated in FIG. 4. According to one exemplary embodiment, the monitoring circuit 400 can be located between the power converter 182 and the cooling fan 186. Although the power distribution modules 160 are disclosed as having processing capabilities, such as through a computer system as shown in FIG. 8, the cooling system monitoring and control components and method disclosed herein do not require processing capabilities within the power module.

Referring to FIG. 9, and also to FIG. 4, the circuit 400 receives power through one or more power converters at a fan current monitor 410. The fan current monitor 410 measures the current drawn by the fan 186 as it cools its module 160. Conventional fans include controllers that increase current draw in the event of fan wear, so as to maintain constant fan speed and accordingly constant cooling performance. A high current draw is thus indicative of wear on the fan 186, such as when the fan bearings become worn. The fans according to the present embodiments can include the conventional functionality of increasing current draw as a response to degradation in fan performance such as through wear. When the fan current monitor 410 detects a current draw above a specified threshold, it generates an Alarm Enable signal that is forwarded to an alarm signal oscillator 420. The Alarm Enable signal can be generated when the fan current exceeds an established threshold value, such as, for example, 10% or more above the nominal power usage value, or a higher threshold, such as 20% or more above nominal.

The alarm signal oscillator 420 generates a reference tone that is provided to a low pass filter 430 that removes unwanted harmonic frequencies from the reference tone generated by the alarm signal oscillator 420. The alarm signal oscillator 420 can generate, for example, a 1 MHz reference tone. The filtered reference tone signal from the low pass filter 430 drives an isolation transformer 450, which provides an Alarm Signal to an RAU coupled to the module 160.

The isolation transformer 450 can, for example, transmit the Alarm Signal over the electrically conductive cable, such as a twisted pair copper cable, used to provide power from the distribution module 160 to the RAU. The Alarm Signal can be transmitted over a frequency suitable for transmission over the medium connecting the power module to the RAU. For example, for CAT 5 cable and similar metallic conductor cables, the frequency of the Alarm Signal can be in the range of 500 Khz to 5 Mhz. The Alarm Signal can be, for example, a relatively simple reference tone of constant frequency, and no modulation.

The RAU connected to a conductor on which the Alarm Signal is transmitted is adapted to receive and recognize the Alarm Signal. The RAU can then provide a Fan Alarm Condition signal over an uplink communication path back to a central control location, such as head end equipment of a distributed antenna system. Referring also to FIG. 3B, in the exemplary distributed antenna system 10, an 'all-optical' optical uplink communication path extends from an RAU 14, through the power distribution module 160, and back to the HEE 12. The uplink communication path may alternatively comprise electrical communication media, or a combination of optical and electrical communication media. The Alarm Signal can be, for example, converted from a tone to a system alarm code indicating the Fan Alarm Condition. The Fan Alarm Condition can be sent over the uplink path to the HEE 12 via a control channel, transmitted as another code in the uplink communications protocol.

When the HEE 12 receives a Fan Alarm Condition signal from an RAU 14, the status of the fan corresponding to the RAU sending the signal may then be monitored for replacement, repair, or other servicing. The HEE 12 may be connected (e.g., networked) to a LAN, an intranet, an extranet, or the Internet. The fan status can thus be remotely monitored. The Fan Alarm Condition signal from the RAU 14 can be transmitted over a control channel separate from the RF transmissions to the HEE 12. According to one embodiment, the Fan Alarm Condition signal can be a 1 MHz signal on a control channel.

Referring also to FIG. 7, each power distribution module 160 can include a monitoring circuit 400 for monitoring an RAU or RAUs coupled to the module 160. The HEE 12 can identify the power distribution module 160 by, for example, the identity of the RAU sending the Alarm Signal to the HEE 12. In this manner, an RAU is responsible to report to the HEE 12 the status of the module 160 from which it is powered. Alternatively, the Alarm Signal can be encoded with an identifying indicia of the potentially faulty fan. Corrective action can thus be directed to the fan that may be on the verge of failure, or that may detract from system performance due to its excessive current draw from the power distribution module 160. Alternatively, a single circuit may monitor power usage of multiple fans in a power unit 162. If fan power consumption is measured as an aggregation, however, more diagnostic work may be required determine which fan among an aggregation of fans is outside of its predetermined operating parameters.

Figure 10:
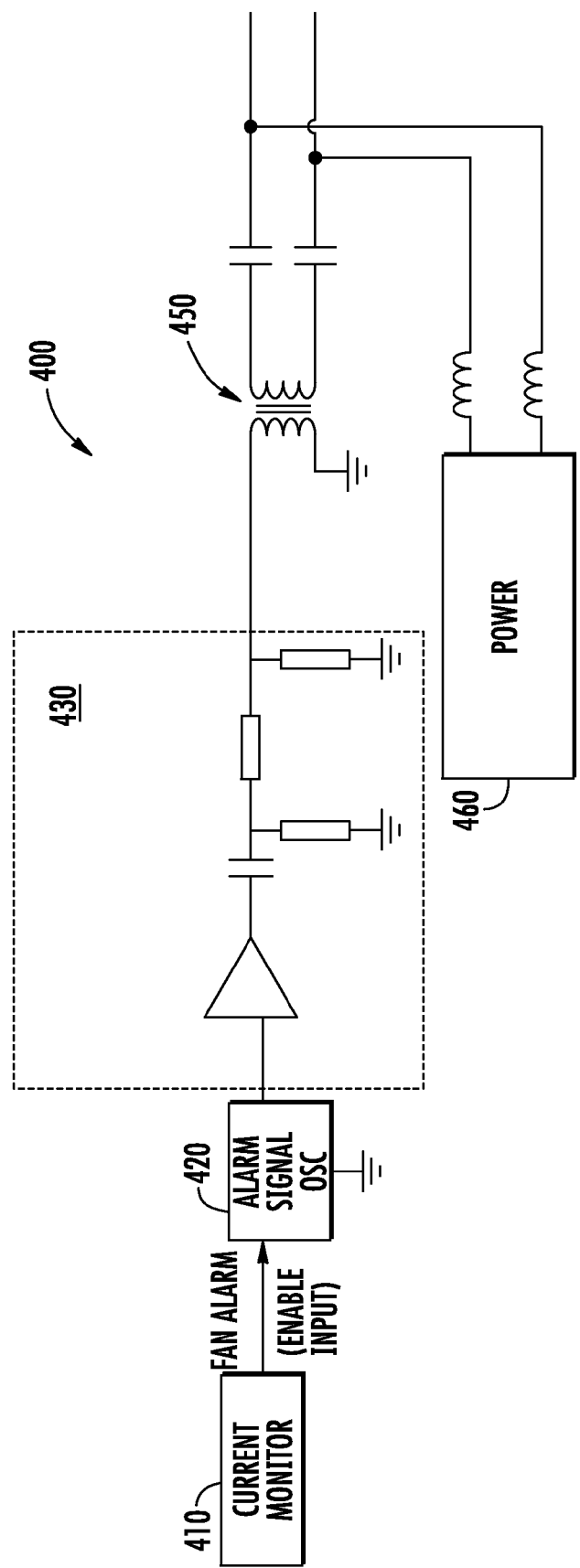
FIG. 10 is a detailed schematic of the fan monitoring circuit.

FIG. 10 is a detailed schematic of the monitoring circuit 400. FIG. 10 illustrates the electronic components of an exemplary embodiment of the low pass filter 430, a line driver 440, and of an exemplary embodiment of the isolation transformer 450. The power source is shown as component 460, and may correspond to the power converter 182 in FIG. 4, or more generally, to the power converter 182 and additional power conditioning and/or generating circuitry.

In this specification, the fan current monitor is shown conceptually as part of the monitoring circuit 400. It is understood that cooling fans of the type used in the power distribution modules may be equipped with a fan current monitor, and that the current monitor may be remote from one or more of the other components in the monitoring circuit.

As used herein, it is intended that terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like. The distributed antenna systems herein can include any type or number of communications mediums, including but not limited to electrical conductors, optical fiber, and air (i.e., wireless transmission).

While computer-readable medium may be shown in an exemplary embodiment as a single medium, the term "computer-readable medium" should be taken to include a single medium or multiple media (e.g., a centralized or distributed database, and/or associated caches and servers) that store the one or more sets of instructions. The term "computer-readable medium" shall also include any medium that is capable of storing, encoding or carrying a set of instructions for execution by the processing device and that cause the processing device to perform any one or more of the methodologies of the embodiments disclosed herein.

The embodiments disclosed herein include various steps. The steps of the embodiments disclosed herein may be performed by hardware components, software components, and combinations thereof.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein.

Unless specifically stated otherwise as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The algorithms and displays presented herein are not inherently related to any particular computer or other apparatus. In addition, the embodiments described herein are not described with reference to any particular programming language.

The various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art.

The operational steps described in any of the exemplary embodiments herein are described to provide examples and may be performed in numerous different sequences other than the illustrated sequences. Furthermore, operations described in a single operational step may actually be performed in a number of different steps.

The antenna arrangements may include any type of antenna desired, including but not limited to dipole, monopole, and slot antennas. The distributed antenna systems that employ the antenna arrangements disclosed herein could include any type or number of communications mediums, including but not limited to electrical conductors, optical fiber, and air (i.e., wireless transmission).

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A distributed communication system, comprising:
   head-end equipment configured to receive downlink electrical radio frequency (RF) communications services signals and to convert the downlink electrical RF communications services signals into downlink optical RF communications services signals to be communicated over at least one optical RF communications services downlink;
   a plurality of remote antenna units; and
   a plurality of power distribution modules, the modules comprising: at least one fan; at least one output power port configured to distribute output power to at least one of the remote antenna units; and a monitoring circuit, wherein
   the monitoring circuit is configured to monitor a power usage of the at least one fan and to provide an alarm signal to at least one of the remote antenna units when the power usage of the at least one fan is outside of predetermined operating parameters.

2. The distributed communication system of claim 1, wherein at least one of the remote antenna units transmits a fan alarm condition signal to the head-end equipment in response to receiving an alarm signal.

3. The distributed communication system of claim 2, wherein a fan is outside of predetermined operating parameters when its power usage is above a predetermined threshold.

4. The distributed communication system of claim 3, wherein the predetermined threshold is at least ten percent above a nominal power usage level.

5. The distributed communication system of claim 2, wherein at least one of the remote antenna units includes an antenna system capable of transmitting RF communications into and receiving RF communications from a coverage area.

6. The distributed communication system of claim 2, wherein the alarm signal is transmitted to the head-end equipment over an all-optical communications path.

7. The distributed communication system of claim 2, further comprising a plurality of power units, each power unit comprising a plurality of the power distribution modules and configured to provide electrical power to pluralities of the remote antenna units.

8. The distributed communication system of claim 7, wherein the distributed communication system is deployed on multiple floors of a building infrastructure, with the head-end equipment being located on a floor, and at least one of the power units being located on at least three different floors.

9. The distributed communication system of claim 2, wherein each power distribution module powers at least one of the remote antenna units, and the remote antenna unit powered by a power distribution module transmits the fan alarm condition signal to the head-end equipment to alert the head-end equipment that the at least one fan of the power distribution module powering that remote antenna unit is outside of predetermined operating parameters.

10. The distributed communication system of claim 9, wherein each monitoring circuit comprises a current monitor that determines fan power usage based on the current consumed by a fan.

11. The distributed communication system of claim 2, wherein the alarm signal is transmitted over at least one electrical conductor used to provide power to a remote antenna unit.

12. The distributed communication system of claim 11, wherein the fan alarm condition signal is transmitted over an all-optical optical communications path.

13. The distributed communication system of claim 12, wherein each of the remote antenna units includes an antenna system capable of transmitting RF communications into and receiving RF communications from a coverage area.

14. The distributed communication system of claim 2, wherein each remote antenna unit is coupled to one of the power units by at least one optical fiber to receive optical communications and at least one metallic electrical conductor to receive power.

15. The distributed communication system of claim 1, further comprising a plurality of power units, each power unit comprising a plurality of the power distribution modules and configured to provide electrical power to pluralities of the remote antenna units, wherein the remote antenna units include an antenna system capable of transmitting RF communications into and receiving RF communications from a coverage area.

16. The distributed communication system of claim 15, wherein each remote antenna unit is coupled to one of the power units by at least one optical fiber to receive optical communications and at least one metallic electrical conductor to receive power.

17. The distributed communication system of claim 15, wherein the distributed communication system is deployed on multiple floors of a building infrastructure, with the head-end equipment being located on a floor, and one of the power units being located on at least three different floors, wherein each monitoring circuit provides the alarm signal over at least one electrical conductor used to provide power to a remote antenna unit.

18. The distributed communication system of claim 1, wherein each of the remote antenna units includes an antenna system capable of transmitting RF communications into and receiving RF communications from a coverage area.

19. A distributed communication system, comprising:
   head-end equipment configured to receive downlink radio frequency (RF) communications services signals and to transmit downlink RF communications services over at least one RF communications services downlink;
   a plurality of remote antenna units configured to receive downlink RF communications services signals from the head-end equipment and to transmit uplink RF communications services signals to the head-end equipment; and
   at least one power distribution module configured to distribute power to at least one of the remote antenna units, the power distribution module comprising at least one fan and being configured to monitor a power usage of the at least one fan and to provide an alarm signal to at least one of the remote antenna units when the power usage of the at least one fan is outside of predetermined operating parameters, wherein at least one of the remote antenna units is configured to transmit a fan alarm condition signal to the head-end equipment in response to receiving an alarm signal.

20. The distributed communication system of claim 19, wherein the remote antenna units include an antenna system capable of transmitting RF communications into and receiving RF communications from a coverage area.

21. The distributed communication system of claim 20, wherein each remote antenna unit is coupled to one of the power units by at least one optical fiber to receive optical communications and at least one metallic electrical conductor to receive power.

22. The distributed communication system of claim 19, wherein a fan is outside of predetermined operating parameters when its power usage is above a predetermined threshold.

23. The distributed communication system of claim 19, further comprising a plurality of power units, each power unit comprising a plurality of the power distribution modules and configured to provide electrical power to pluralities of the remote antenna units.

24. The distributed communication system of claim 23, wherein each remote antenna unit includes an antenna system capable of transmitting RF communications into and receiving RF communications from a coverage area.

25. The distributed communication system of claim 24, wherein the distributed communication system is deployed on multiple floors of a building infrastructure, with the head-end equipment being located on a floor, and at least one of the power units being located on at least three different floors.

26. The distributed communication system of claim 19, wherein each power distribution module powers at least one of the remote antenna units, and the remote antenna unit powered by a power distribution module transmits the fan alarm condition signal to the head-end equipment to alert the head-end equipment that the at least one fan of the power distribution module powering that remote antenna unit is outside of predetermined operating parameters.

27. The distributed communication system of claim 19, wherein the alarm signal is transmitted over at least one electrical conductor used to provide power to a remote antenna unit.

28. A method of monitoring a distributed communication system comprising head-end equipment configured to receive downlink radio frequency (RF) communications services signals and to transmit downlink RF communications services over at least one RF communications services downlink, a plurality of remote antenna units configured to receive downlink RF communications services signals from the head-end equipment and to transmit uplink RF communications services signals to the head-end equipment, and at least one power distribution module configured to distribute power to at least one of the remote antenna units, the method comprising:

monitoring a power usage of at least one fan;

providing an alarm signal to at least one of the remote antenna units when the power usage of the at least one fan is outside of predetermined operating parameters; and transmitting a fan alarm condition signal from the remote antenna unit receiving the alarm signal to the head-end equipment.

29. The method of claim 28, wherein the remote antenna units include an antenna system capable of transmitting RF communications into and receiving RF communications from a coverage area.

30. The method of claim 29, wherein the alarm signal is transmitted over an electrically conductive medium used to provide power to a remote antenna unit.

31. The method of claim 29, wherein the fan alarm condition signal is transmitted over an optically conductive medium to the head-end equipment.

32. The method of claim 29, wherein a fan is outside of predetermined operating parameters when its power usage is above a predetermined threshold.

33. The method of claim 29, wherein the distributed communication system is deployed on multiple floors of a building infrastructure, with the head-end equipment being located on a floor, and one of the power units being located on at least three different floors.

* * * * *